United States Patent [19]

Bourassa et al.

[11] Patent Number: 4,560,419

[45] Date of Patent: Dec. 24, 1985

[54] METHOD OF MAKING POLYSILICON RESISTORS WITH A LOW THERMAL ACTIVATION ENERGY

[75] Inventors: Ronald R. Bourassa; Douglas B. Butler, both of Colorado Springs, Colo.

[73] Assignee: Inmos Corporation, Colorado Springs, Colo.

[21] Appl. No.: 615,166

[22] Filed: May 30, 1984

[51] Int. Cl.[4] .................. H01L 21/263; H01L 21/26; H01L 21/425

[52] U.S. Cl. .................................. 148/1.5; 29/576 B; 29/576 T; 148/187; 357/59; 357/91; 427/53.1

[58] Field of Search ............... 148/1.5, 187; 29/576 B, 29/576 T; 427/53.1; 357/59, 91

[56] References Cited

U.S. PATENT DOCUMENTS

| | | | |
|---|---|---|---|
| 3,943,545 | 3/1976 | Kim | 357/24 |
| 4,041,522 | 8/1977 | Oguey et al. | 357/42 |
| 4,214,918 | 7/1980 | Gat et al. | 148/1.5 |
| 4,309,224 | 1/1982 | Shibata | 148/1.5 |
| 4,331,485 | 5/1982 | Gat | 148/1.5 |
| 4,377,819 | 3/1983 | Sakai et al. | 357/59 |
| 4,394,191 | 7/1983 | Wada et al. | 148/33.1 |
| 4,409,724 | 10/1983 | Tasch, Jr. et al. | 29/571 |
| 4,462,150 | 7/1984 | Nishimura et al. | 29/576 B |
| 4,467,518 | 8/1984 | Bansal et al. | 29/576 B |
| 4,467,519 | 8/1984 | Glang et al. | 29/576 B |

FOREIGN PATENT DOCUMENTS 0087354  7/1981  Japan .................. 29/576 B

OTHER PUBLICATIONS

Mahan et al., IEEE-Trans. Electron Devices, ED-30, (Jan. 1983), 45.
Lloyd et al., IBM-TDB, 23, (1980), 2811.
Kugimiya et al., Jap. Jour. Appl. Phys., 21, (1982), L-19.
Borisenko et al., Phys. Stat. Solidi, 75a, (1983), 117.
Nishiyama et al., Jap. Jour. Appl. Phys., 19, (1980), L-563.
Kugimiya et al., Jap. Jour. Appl. Phys., 21, (1982), p. L-16.
Powell et al., Jour. Vac. Sci. Technol., 20, (1982), 33.
Takebayashi et al., Jour. Electrochem. Soc., 130, (Nov. 1983), 2271.

Primary Examiner—Upendra Roy
Attorney, Agent, or Firm—Edward D. Manzo

[57] ABSTRACT

An improved process in making a polysilicon resistor suitable for use as a load resistor in a static memory wherein after the doping of the polysilicon, the device is annealed by exposing it to a rapid increase of ambient temperature (up to between 900° and 1200° C.), maintaining the high ambient temperature for a controlled time (about 5 seconds) and then lowering the ambient temperature at a rapid rate. This decreases resistance by one order of magnitude and significantly decreases the temperature activation energy of the resistor. This permits static memory cells to retain data even though the cell has high leakage currents, thereby improving final test yields.

21 Claims, 12 Drawing Figures

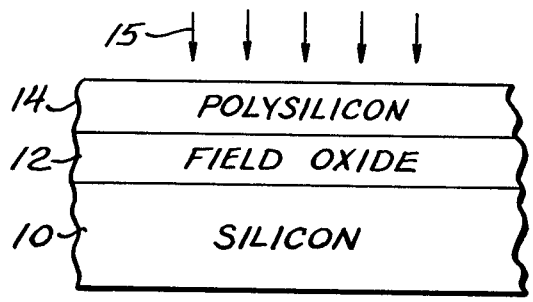
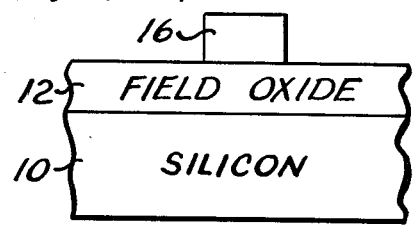
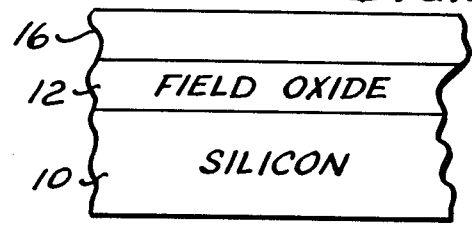
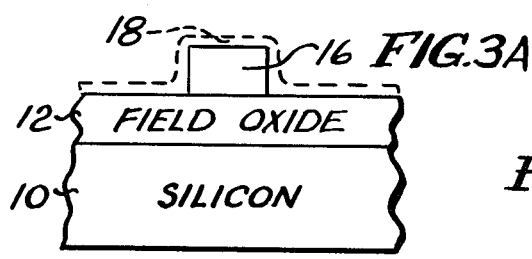
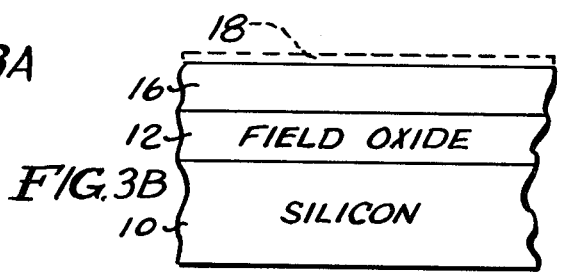
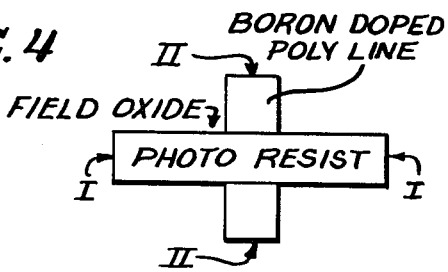
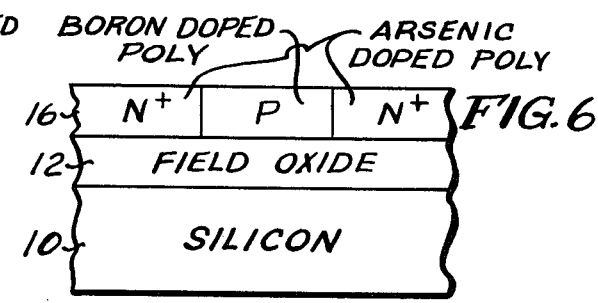
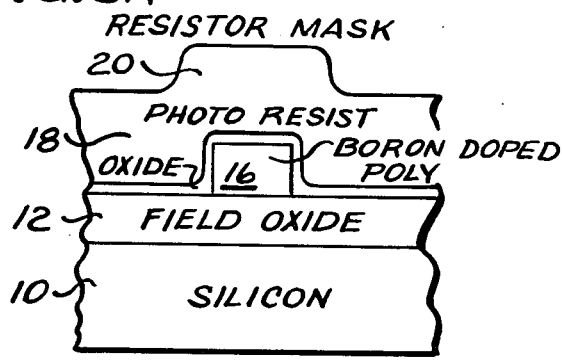
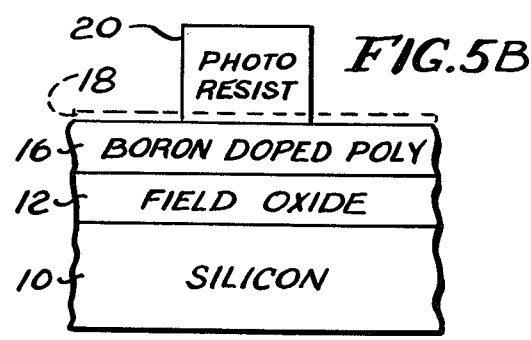

METHOD OF MAKING POLYSILICON RESISTORS WITH A LOW THERMAL ACTIVATION ENERGY

BACKGROUND OF THE INVENTION

The present invention relates to semiconductor resistors of the type typically used in random access memories. More particularly, the present invention is concerned with a method for the fabrication of polysilicon resistors with low thermal activation energy. Resistors of this type are disclosed in Bourassa, "Polysilicon Resistor With Low Thermal Activation Energy," filed in the U.S. Patent Office on Dec. 15, 1982 having Ser. No. 449,984, whose disclosure is hereby incorporated hereto.

The prior Bourassa patent application disclosed a polysilicon resistor illustratively having the form of a polysilicon structure separated from the substrate by an insulator or dielectric. The poly structure has a central portion doped with P type impurity having beside it regions doped with N type impurity, the dopiings being such that the thermal activation energy is below about 0.5 electron volts. It was further disclosed that the middle region could be doped with both P type and N type impurities. Of course, the resistor could be formed with P type regions on the outside and an N type region on the inside. It was found that the low thermal activation energy permitted the construction of a polysilicon device within the desired resistance range at normal operating temperatures, but the resistor would be able to mask appreciable leakage current even at low temperatures, without the disadvantage of drawing excessive current at high temperatures. The typical resistance for load resistors in static RAMS is approximately 0.1 to 50 gigaohms.

The present invention is concerned with a method for fabricating resistances suitable for use as load devices in static RAMS, for example. The prior Bourassa application disclosed methods of fabricating such devices, but did not disclose the present invention herein. Briefly, the prior Bourassa patent application set forth at least three methods for making the resistors there disclosed. The first method was to obtain a field oxide on top of a silicon substrate, depositing polysilicon over the insulating layer, doping the polysilicon uniformly with N type dopant at a concentration of up to about $10^{20}$ per cubic centimeter, then doping the polysilicon uniformly with P type dopant of equal or greater concentration but not less than $10^{18}$ per cubic centimeter. The next step described was to mask the resistor area and then dope the unmasked portion of the polysilicon with N type dopant at a concentration greater than the P type dopant.

The second method disclosed in the prior patent application also obtains a polysilicon layer separated from a monocrystalline silicon substrate layer by an insulating layer. Next, the resistor area is masked and the remaining polysilicon is doped with N type dopant at a concentration up to about $10^{21}$ per cubic centimeter. Next, the entire poly area is masked except for the resistor area which is then doped with N type impurity at a concentration of up to about $10^{20}$ per cubic centimeter. Next, with the mask still in place, the resistor area is doped with P type impurity at a concentration of between about $10^{18}$ and $10^{20}$ per cubic centimeter (but greater than or equal to the concentration of N type dopant which the resistor area was doped).

The third method disclosed in the prior Bourassa patent application is to obtain a polysilicon layer upon an insulating layer upon a silicon substrate. Next the polysilicon is doped uniformly with N type impurities at a concentration of up to about $10^{20}$ per cubic centimeter. After etching the poly lines, the entire circuit except for the resistor area is masked so that the resistor area can be doped with P type impurities at a concentration exceeding the concentration of the N type impurities.

Those methods resulted in the formation of a polysilicon resistor having a thermal activation energy in the range of about 0.1 to about 0.35 electron volts, which is considerably more effective than the activation energy of 0.5 to about 0.6 electron volts for normal polysilicon resistors. The advantage of such a structure is that such improved polysilicon resistors can tolerate more leakage at cold temperatures without reducing the voltage at the memory cell node so much that the memory cell would change state, while still staying within maximum current limits at high temperatures. Additionally, the sensitivity of the resistor to dopant concentration is drastically reduced, viz. from 5.3 decades per decade (resistance versus dopant concentration) down to 0.2 decades per decade. Other advantages are described in the prior Bourassa patent application.

The present invention relates to a further processing step involved in the fabrication of polysilicon resistors. Herein, the expression "diode" or "diodes" is occasionally used to mean a polysilicon resistance. This is because the resulting structure, considering the doping and configurations thereof, electrically resembles back-to-back diodes.

SUMMARY OF THE INVENTION

According to various aspects of the present invention, a poly resistor is formed preferably having a middle portion doped with one type of impurity and lateral contiguous portions doped with the other type of impurity, thus forming an NPN or PNP type of structure, illustratively. Next, a heat treatment is provided in the fabrication of the polysilicon resistor. In its preferred form, there is a rapid anneal wherein the temperature of the entire wafer bearing the polysilicon resistors is raised quickly to, in the preferred embodiment, 1100° C. for 5 seconds and cooled rapidly. This is done before metal is added to the devices. As a result of this heat treatment, it is found that the resistance characteristics are improved. The resistance has been found to drop approximately one order of magnitude. The resistance can be adjusted or controlled by adjusting the temperature of the heat treatment or the time of it, or by controlling the cooling speed.

Devices which have been processed according to the preferred embodiment of the present invention undergo a physical change to some extent. Defects become mobile during the heat treatment and tend to move. This heat treatment passivates grain boundaries. The polysilicon recrystallizes and is much closer to the single crystalline form or state.

The heat treatment step also is found to lower the thermal activation energy. Without the rapid anneal of the preferred embodiment, the thermal activation energy has been about 0.21 electron volts. By using the rapid anneal of the preferred embodiment, however, the thermal activation energy is reduced to about 0.13 electron volts. As explained in the prior Bourassa patent application, this is an improvement in terms of the overall capabilities of the resistor because the resistor is used to mask leakage caused by defects. Indeed, the leakage itself can be thought of as having a temperature activation energy which is at least about 0.2 electron volts. If the thermal activation energy of a polysilicon resistor can be made lower than the activation energy for the defect or the leakage, then at lower temperatures, the polysilicon resistor can mask more current than is masked at room temperature. This becomes important because cold temperature testing is both difficult and expensive: condensation can freeze on probe tips at the low temperatures causing rejection of good units.

As a result, by using this invention, cold temperature testing can be eliminated because the resulting polysilicon resistors function quite well over the low temperature range. If a manufacturer normally runs two high temperature tests and one cold temperature test, then by virtue of using the present invention, satisfactory testing may be obtained with just two tests. This increases the test capacity of the manufacturer by thirty-three percent.

At cold temperatures, generally the only failures of significance in a memory are data retention failures. These are due to junction leakage. By virtue of the present invention, the polysilicon resistors would allow devices to operate successfully with junction leakage levels up to ten times higher than previous resistors. Consequently, the present invention results in a great enhancement of final test yield, which is certainly a vital concern to every manufacturer.

BRIEF DESCRIPTION OF THE DRAWINGS

In describing the preferred embodiment, reference will be made to accompanying drawings of which:

FIG. 1 is a cross-sectional view of semiconductor elements used in making a polysilicon resistor;

FIG. 2A is a cross-sectional view showing a poly line where the resistor is to be made, and FIG. 2B is a side view of FIG. 2A structure;

FIGS. 3A and 3B are cross-sectional and side views, showing the oxide formed in a subsequent treatment step;

FIG. 4 is a top view showing the orientation of a photoresist on the poly line;

FIG. 5A is a sectional view along line I—I of FIG. 4, and FIG. 5B is a sectional view along lines II—II of FIG. 4;

FIG. 6 shows the resulting structure;

DETAILED DESCRIPTION OF A PREFERRED EMBODIMENT

Figure 7:
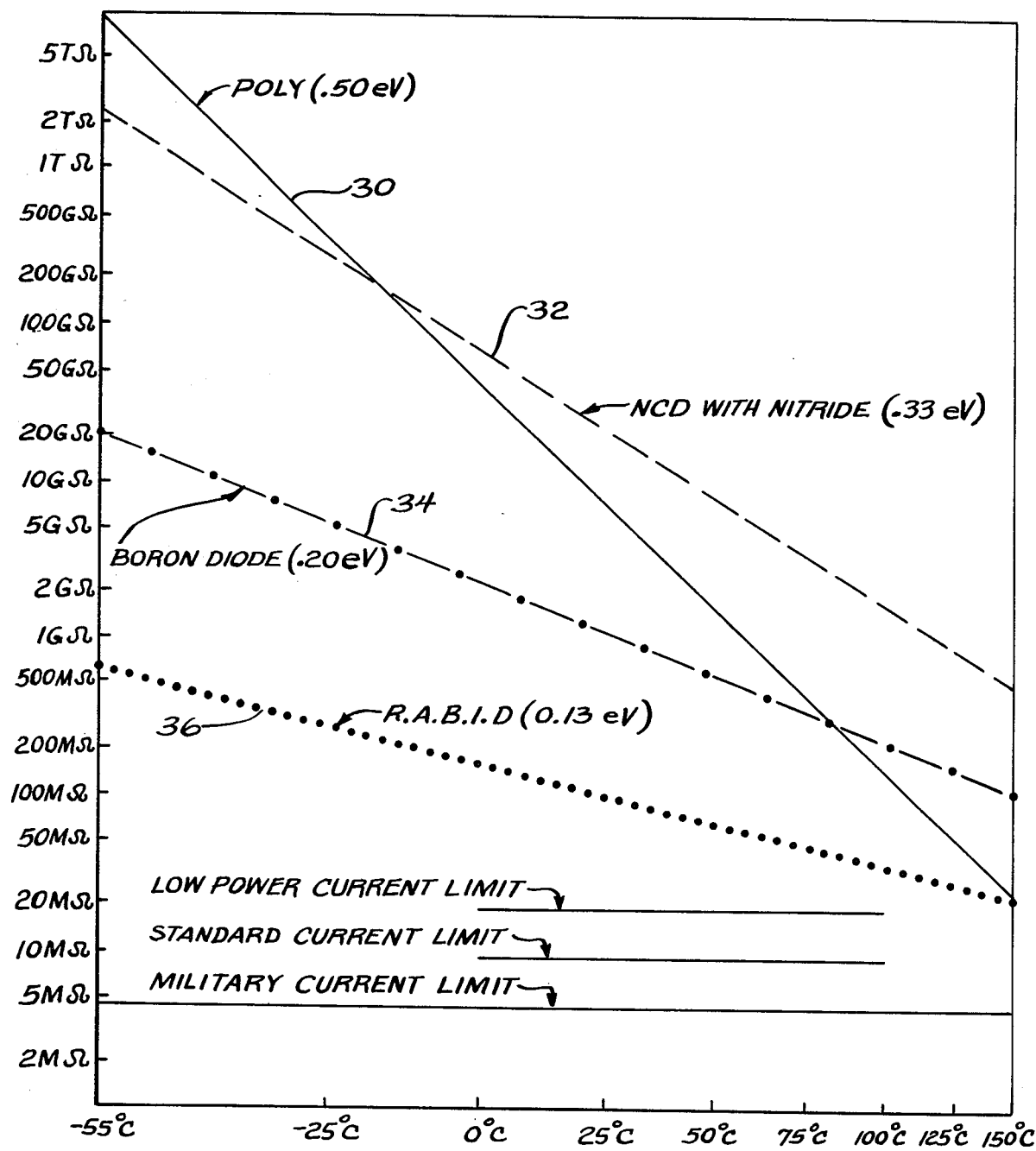
FIG. 7 is a graph comparing a resistor resulting from the present invention to prior devices.

A semiconductor device fabricated according to the preferred embodiment of the present invention can be called "RABID" which is an acronym meaning Rapid Annealed Boron Implanted Diode.

FIG. 1 represents a cross-sectional view of semiconductor elements. A substrate 10 of silicon is covered with about 6000 angstroms of field oxide or gate oxide 12. A layer 14 of polysilicon which is about 4500 Angstroms thick is on top of layer 12. The entire layer 14 of polysilicon is then implanted with boron represented by arrows 15 illustratively at 27 keV to result in a doping of about $1 \times 10^{15}$ per square centimeter. It will be appreciated that this is a relatively light doping. This causes the polysilicon to become P type.

Next, the polysilicon is defined by traditional techniques, such as using a mask to result in a polysilicon line 16 on top of the oxide 12. FIG. 2A is a cross-sectional view of these elements. FIG. 2B is a side view of the structure shown in FIG. 2A.

The next step is to heat the polysilicon in a steam atmosphere. This causes the implanted boron to be distributed throughout the polysilicon line 16. Additionally, it results in a layer of thermal oxide 18 having a thickness of about 400 to 500 angstroms as shown in FIG. 3A in cross-section and FIG. 3B in a side view.

Next, a photoresist is placed across the top of the poly line 16. A top view showing the relative orientation of the photoresist 20 in this illustrative embodiment is shown in FIG. 4. FIG. 5A is a cross-sectional view taken along a line I—I of FIG. 4, and FIG. 5B is a side sectional view taken along a lines II—II of FIG. 4. Mask 20 is called a source-drain implant mask by those skilled in the art. This mask has a thickness of approximately 10,000 angstroms over the top of the poly line 16. After the photoresist is formed, according to the preferred embodiment, there is a heavy implanting of arsenic at the ends of the section of the poly line 16 which is to be the resistor. This arsensic doping of portions which are not masked makes the polysilicon N type where it is doped with arsenic. The region of poly line 16 which is masked by photoresist 20 will remain as P type, but it will be sandwiched between two N type regions. This makes an arrangement somewhat like NPN back-to-back boron silicon diodes. This arsenic implant step can optionally be combined with the source-drain implant at about 180 keV with a doping of about $5 \times 10^{15}$ per square centimeter.

Next the mask 20 photoresist is removed to result in the structure illustrated in FIG. 6, a side sectional view corresponding to FIG. 5B, which illustrates the arsenic doped polysilicon-regions 22, 24 and the boron doped central region 26, all within poly line 16. The resulting N+ P N+ structure has the electrical characteristics of back-to-back boron diodes in polysilicon. The reverse bias resistivity is a function of heat treatments, doping concentrations, ambient conditions during the heat cycles and the voltage. For normal processing and a 1000° C. reflow, the resistor value will be about $1 \times 10^9$ ohms at 5 volts for a cross-sectional area of about one square micron.

Before and after the formation of this structure, other steps are accomplished to make the transistors and other structures needed in the memory or other type of integrated circuit.

However, before adding metal (aluminum) to the devices, a rapid anneal step is accomplished according to the preferred embodiment of the present invention. This can be achieved by the use of a heating device using halogen heat lamps. For example, the HEATPULSE 2101 Automatic Single-Wafer Heating System made by AG Associates of Palo Alto, Calif. 94303 is suitable. A different heating device, such as a Varian graphite heater, can be used. The type of heating device can be varied within the scope of the present invention. When using heat lamps in the HEATPULSE 2101, after placing the wafer containing the devices to be heated in the chamber, the heat lamp is turned on. The wafer heats up rapidly, e.g. in less than 20 seconds. The atmosphere is argon, nitrogen or air. The wafer is kept in this environment for two or more seconds, but preferably about 5 seconds. (However, if it is kept too long in these ambient conditions, the junctions would move too far causing deleterious effects on device characteristics.) Next, the power to the lamps is decreased as rapidly as possible to freeze in the high temperature defect distribution.

It is believed that the polysilicon recrystallizes as a result of this annealing step. The recrystallization would reduce the potential barriers due to grain boundaries. Also, it would activate more of the dopant material. The combined result of the decreased grain boundary potential and the increased free carrier concentration results in an increase in the reverse bias current of the polysilicon diode for a given voltage. Consequently, the effective resistance of the diode is reduced by about one order of magnitude. Other resistances in the circuit are also reduced. In particular, the resistivity doped poly is reduced by about 21%, and the resistance of a buried contact is reduced by about 32%. Both of these effects increase the speed of the memory device. Even the resistivity of the doped single crystal silicon is reduced by 15%.

It has been found that the maximum sustained temperature should not exceed 1200° C., and best results were achieved at an anneal temperature of 1100° C. The anneal time can range from 2 seconds to 20 seconds without causing a drop in probe yield. The shorter the anneal time the larger the drop in the value of the cell resistor (RCELL). Other resistances such as the poly resistivity (RPOLY) and the buried contact resistance (RBC) do not show this effect. The maximum decrease is reached in less than two seconds and does not change with anneal time. The following Table 1 shows the results of testing (in terms of average numbers with standard deviations) where there was variation in the anneal time.

TABLE 1

| Anneal Time at 1100° C. (sec) | | Die Per Wafer | RCELL (GΩ) | RPOLY (Ω/□) | RBC (KΩ) |
| --- | --- | --- | --- | --- | --- |
| 2 | AVERAGE | 182.0 | 0.134 | 18.25 | 43.96 |
|   | STAN DEV | 26.5 | 0.006 | 0.31 | 2.65 |
| 5 | AVERAGE | 176.8 | 0.150 | 18.06 | 45.98 |
|   | STAN DEV | 37.2 | 0.005 | 0.45 | 2.57 |
| 10 | AVERAGE | 172.5 | 0.182 | 18.17 | 44.98 |
|    | STAN DEV | 36.1 | 0.003 | 0.25 | 3.08 |
| 20 | AVERAGE | 184.0 | 0.222 | 18.45 | 43.74 |
|    | STAN DEV | 26.2 | 0.009 | 0.45 | 0.85 |

The anneal time can be chosen to give the resistance desired. Best overall results were obtained for a 2. second anneal time at a temperature of 1100° C. with maximum cooling rate.

In terms of junction leakage failures, polysilicon resistors made according to the preferred embodiment of the present invention compare favorably to the boron doped polysilicon resistors described in the prior Bourassa patent application. When the boron resistors were used in a static memory, particularly the Inmos IMS 1400 device, junction leakage was tested by applying negative 10 volts to the substrate and checking for data retention. The boron resistors showed junction leakage failures of 38%, 24.4%, 14.7%, and 15% (average 21.2%); whereas the memory using RABID resistors exhibited junction leakage failures of 1.85%, 0%, 0.68%, and 2.09% (for an average of 1.13%). It is clear, therefore, that RABID resistors have fewer junction leakage failures.

FIG. 7 illustrates the resistance versus temperature curves for various resistor types which can be used in a static memory. A standard polysilicon resistor has an activation energy of about 0.5 electron volts and has the widest variation over the temperature range of −55° C. to 100° C. It is represented by curve 30 in FIG. 7. A so-called "nearly compensated diode" (NCD) is illustrated by curve 32. This device is described in the prior Bourassa patent application and consists of a polysilicon resistor having both P type and N type impurities in the central region with P type or N type impurities in the lateral two regions. That type of device has a thermal activation energy of about 0.33 electron volts. The so-called "boron diode" also described in the prior Bourassa application is represented by curve 34, and it has a thermal activation energy of about 0.20 electron volts. The resistor represented by curve 34 does not have a wide variation in resistance over the total temperature range. Curve 36 represents the device of curve 34 but with processing according to the present invention. This RABID resistor has a thermal activation energy of 0.13 electron volts. Also, it can be seen that the resistance is lower over the entire temperature range depicted in FIG. 7. Curve 36 is close to ideal in that it will mask 10 nanoamps of leakage even at −55° C. Yet, it will not cause the memory to exceed the low power current limit at 150° C.

Figure 8:
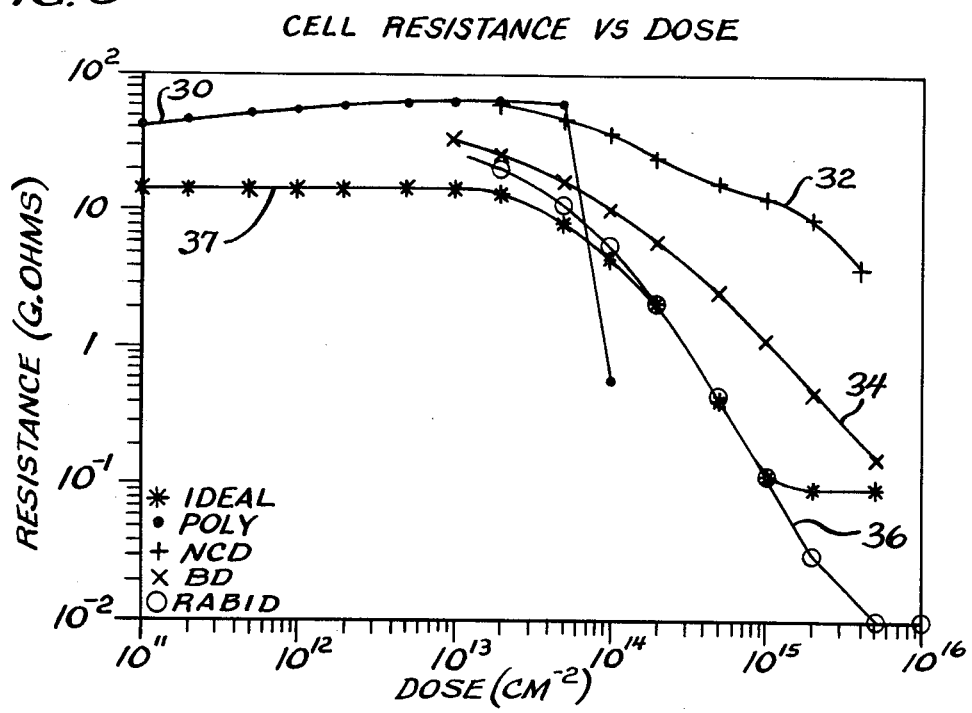
FIG. 8 is a graph showing resistance plotted against implant dosage for the present invention compared to prior resistor types.

FIG. 8 uses the same reference numerals as FIG. 7 and graphically shows the variation of resistance (in gigaohms) with dosage (per square centimeter). To generate FIG. 8, wafers carrying Inmos IMS 1400 or 1420 memories in fabrication received a 5 second, 1100° C. rapid anneal followed by cooling. An ideal curve 37 is made from computed resistor values which will just meet the low power limit at high temperature and have temperature activation energies attainable for a given dose. It can be seen that RABID resistors (curve 36) follow the ideal curve 37 in the boron dose range from $10^{14}$ to $10^{15}$ per square centimeter. The dose given in FIG. 8 (and FIG. 9) can be expressed as concentration, if desired. Using the thickness of 4500 angstroms specified supra, the concentration at a dose of $1 \times 10^{15}$ is $2.22 \times 10^{19}$ per cm$^3$. This is obtained by the relationship that concentration equals dose divided by thickness.

Figure 9:
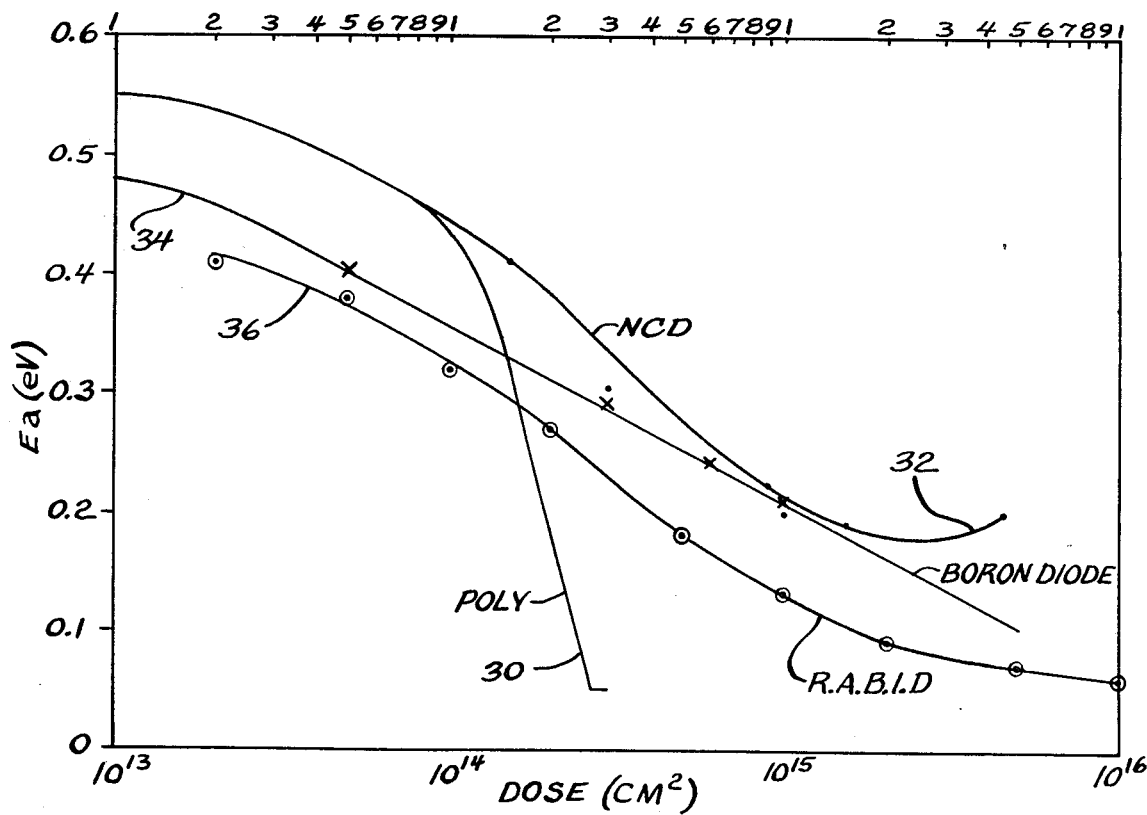
FIG. 9 is a graph plotting thermal activation energy against dosage for several types of resistors.

FIG. 9 also follows the reference numerals of FIG. 7 and illustrates the activation energies for various resistor types. It will be seen that the RABID device (curve 36) has lower thermal activation energy for a given dose than either NCD or boron diode type resistors. To take an example from these figures, consider that one wanted to provide a resistance of 1 gigaohm at room temperature. FIG. 8 shows that for the resistors plotted there, only the standard polysilicon resistor (curve 30), the RABID resistor (curve 36), and the boron diode resistor (curve 34) are able to meet this requirement. The standard poly resistor would require a dose of about $1 \times 10^{14}$ cm$^{-2}$. The RABID resistor would require a dose of about $3 \times 10^{14}$ cm$^{-2}$. The boron diode resistor would require a dose of about $1 \times 10^{15}$ cm$^{-2}$. The activation energy of these resistors is shown in FIG. 9 as a function of dose. Thus, FIG. 9 shows that a standard poly resistor doped to $1 \times 10^{14}$ would have an activation energy of about 0.44 eV. The RABID resistor at $3 \times 10^{14}$ would be about 0.23 eV, and the boron diode at $1 \times 10^{15}$ would be about 0.21 eV. The 0.44 eV activation energy of the standard poly resistor would be unacceptable because it would cause the associated static RAM cell to draw too much current at high temperatures (over 125° C.). At low temperature (−55° C.), such a poly resistor would mask too little leakage current. As between the RABID resistor and the boron diode resistor, the RABID is preferable. The advantage of the RABID resistor is twofold. First, the desired resistance value is obtained with a lower dose (meaning a saving of implanter time). Second, if the resistor is being used in a static RAM as a load resistor, then, as discussed supra, the junction leakage failures would be reduced.

If one wanted to provide a resistance of only 0.1 gigaohms, then the RABID resistor would require a dose of about $1 \times 10^{15}$ and the boron diode resistor, by extrapolating curve 34 in FIG. 8, would require about $1 \times 10^{16}$, a dose which requires ten times as much implanter time. Also, persons skilled in the art will recognize that so high a dose of boron in a part can lead to other circuit problems. FIG. 8 shows curves which provide dosages which are compatible with present day technology, and the dosage of about $10^{16}$ for the boron diodes is at the limit of usefulness.

Put another way, if one were to limit the dose to $1 \times 10^{15}$, then using the present invention, a resistance value of about 0.1 gigaohm with an activation energy of about 0.13 eV could be obtained. Also, one could fabricate a boron diode resistor of about 1.0 gigaohms with an activation energy of about 0.21 eV, or an NCD resistor at about 15 gigaohms with an activation energy of about 0.22 eV. Clearly, the RABID resistor is preferable, for reasons which have been discussed. Even though the high dose yields a RABID resistor with only 0.1 gigaohms, FIG. 7 shows that this resistor stays within the current limits at high temperatures and masks more leakage current than any other type of resistor at low temperatures.

In conclusion, the rapid heat annealing step in the fabrication of polysilicon resistors according to the present invention results in a resistor which at 0° C. will mask up to 30 nanoamperes of current, compared to only two nanoamperes for a standard boron doped polysilicon resistor, and merely 0.1 nanoamps for a standard polysilicon resistor. At the military cold temperature test of −55° C., the RABID resistor of the present invention will mask 8 nanoamperes compared to 0.3 nanoamperes for a boron doped polysilicon resistor without the rapid annealing process, and compared to 0.5 picoamperes for a standard polysilicon resistor. Thus, the present invention leads to dramatically improved performance.

In Ser. No. 449,984 there is disclosed a polysilicon structure with middle and contiguous lateral regions. The middle region may have one type of impurity with the lateral regions having the other type of impurity. Moreover, it is further disclosed that the middle region may be "nearly compensated" by being doped with both p type and n type impurities. The rapid annealing can be used on a poly structure which has a middle region with both types of impurity.

It will be appreciated that the present invention is not limited to the specific description stated herein. Persons skilled in the art after comprehending the present disclosure and invention will find other embodiments within the true spirit and scope of the present invention.

What is claimed as the invention is:

1. A method for fabricating a resistor in polysilicon for a semiconductor integrated circuit comprising:

doping a first region of polysilicon with one electrical type of doping impurity;

doping a second region of polysilicon adjacent to said first region with the other electrical type of doping impurity to form a polysilicon structure with first and second regions; and lowering the resistivity and thermal activation energy of the polysilicon structure below 0.20 eV by heat treating the polysilicon structure.

2. The method according to claim 1 wherein said heat treating step comprises rapid annealing.

3. The improvement according to claim 1 wherein said heat treating step comprises subjecting the polysilicon structure to a rapid change in ambient temperature up to greater than 900° but less than about 1200° C., and maintaining the ambient temperature for about 5 seconds.

4. The method according to claim 2 wherein said annealing step comprises rapid thermal annealing by exposing the polysilicon to an anneal temperature of about 1100 degrees centigrade.

5. The method according to claim 2, said annealing comprising rapidly heating the device by exposure of the polysilicon to high intensity radiation, maintaining a high ambient temperature, and then turning off the source of said radiation.

6. The method of claim 2 including, prior to said annealing step, forming a polysilicon structure having a first region of polysilicon doped with one type of impurity and second and third regions of polysilicon doped with the other type of impurity, said first region being adjacent to and contacting said second and third regions.

7. The method of claim 6 wherein said first region is located between said second and third regions.

8. The method of claim 6 including doping a poly layer with one type of impurity, defining the resistor area, and selectively doping with the other type of impurity.

9. The method of claim 6 wherein said annealing step comprises rapidly annealing said poly regions.

10. The method of claim 6 including doping said first region with both p type and n type impurities.

11. The method of claim 7 including establishing said first, second and third poly regions to form back-to-back polysilicon diodes.

12. The method of claim 8 including doping a poly layer with the type of impurity for said first region of poly, then defining the poly which is to act as the resistor, the selectively doping said second and third regions of poly with the other type of impurity.

13. The method of claim 12 wherein the dopant of said first region comprises boron.

14. The method of claim 9 wherein said annealing step comprises heat pulsing.

15. The method of claim 9 further including permitting the polysilicon to cool after said annealing by quickly decreasing the application of heat or other form of energy being used for said annealing.

16. A method for fabricating a polysilicon resistor for a semiconductor integrated circuit including:

doping a middle region of polysilicon with one electrical type of impurity;

doping lateral regions of polysilicon in contact with and adjacent to said middle region with the other electrical type of impurity; and lowering the thermal activation energy of the structure below 0.20 eV by radiating said regions of polysilicon with radiant energy applied by a high intensity source.

17. The method of claim 16 where said high intensity source comprises a heat lamp.

18. The method of claim 16 wherein said high intensity source comprises a graphite heater.

19. The method of claim 16 wherein said doping of a middle region comprises doping to achieve a concentration therein below about $2.22 \times 10^{20}$ atoms per cubic centimeter and wherein said lowering step lowers the thermal activation energy defined by a monotonic curve wherein the activation energy at $2.22 \times 10^{19}$ atoms per cubic centimeter concentration is below 0.20 eV.

20. The method of claim 16 wherein said method provides a resistor having a thermal activation energy which is lower than that of a back-to-back boron diode in polysilicon doped to the same concentration, over a range of about $2 \times 10^{18}$ to $2 \times 10^{19}$ atoms per cubic centimeter.

21. The method of claim 19 wherein said curve has a thermal activation energy of about 0.13 eV at a concentration of $2.22 \times 10^{19}$ atoms per cubic centimeter and about 0.32 eV at a concentration of about $2.22 \times 10^{18}$ atoms per cubic centimeter.

* * * * *